United States Patent
Van Herpen et al.

(10) Patent No.: US 7,233,010 B2
(45) Date of Patent: Jun. 19, 2007

(54) RADIATION SYSTEM AND LITHOGRAPHIC APPARATUS

(75) Inventors: Maarten Marinus Johannes Wilhelmus Van Herpen, Heesch (NL); Vadim Yevgenyevich Banine, Helmond (NL); Arnoud Cornelis Wassink, Veldhoven (NL); Derk Jan Wildred Klunder, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 200 days.

(21) Appl. No.: 11/133,460

(22) Filed: May 20, 2005

(65) Prior Publication Data

US 2006/0261290 A1 Nov. 23, 2006

(51) Int. Cl.
*G03F 7/20* (2006.01)
(52) U.S. Cl. ................. 250/492.2; 250/492.1
(58) Field of Classification Search .......... 250/492.2, 250/504 R, 492.1; 378/119, 143
See application file for complete search history.

(56) References Cited

U.S. PATENT DOCUMENTS

| | | | |
|---|---|---|---|
| 6,359,969 B1* | 3/2002 | Shmaenok | 378/156 |
| 6,459,472 B1 | 10/2002 | De Jager et al. | 355/68 |
| 6,838,684 B2 | 1/2005 | Bakker et al. | 250/492.2 |
| 6,927,403 B2* | 8/2005 | Singer et al. | 250/461.1 |
| 6,972,421 B2* | 12/2005 | Melnychuk et al. | 250/504 R |
| 7,030,958 B2* | 4/2006 | Luijkx et al. | 355/30 |
| 7,049,614 B2* | 5/2006 | Rice | 250/504 R |
| 7,057,190 B2 | 6/2006 | Bakker et al. | 250/492.2 |
| 2003/0095623 A1* | 5/2003 | Singer et al. | 378/34 |
| 2004/0121243 A1 | 6/2004 | Chandhok et al. | |
| 2004/0141165 A1* | 7/2004 | Zukavishvili et al. | 355/53 |
| 2004/0184014 A1 | 9/2004 | Bakker et al. | 355/30 |
| 2005/0140957 A1* | 6/2005 | Luijkx et al. | 355/71 |
| 2005/0244572 A1* | 11/2005 | Bristol et al. | 427/162 |
| 2005/0253092 A1* | 11/2005 | Zukavishvili et al. | 250/492.2 |
| 2006/0012761 A1 | 1/2006 | Bakker et al. | 355/30 |
| 2006/0131515 A1* | 6/2006 | Partlo et al. | 250/504 R |
| 2006/0138348 A1* | 6/2006 | Bakker | 250/492.1 |
| 2006/0138362 A1 | 6/2006 | Bakker et al. | 250/504 |
| 2006/0146413 A1* | 7/2006 | Klunder et al. | 359/634 |
| 2006/0151717 A1 | 7/2006 | Klunder et al. | 250/492.2 |
| 2006/0175558 A1* | 8/2006 | Bakker et al. | 250/492.2 |
| 2006/0186353 A1* | 8/2006 | Wassink | 250/492.2 |
| 2006/0219958 A1* | 10/2006 | Wassink | 250/504 R |
| 2006/0278833 A1* | 12/2006 | Van Herpen et al. | 250/492.22 |
| 2006/0289811 A1* | 12/2006 | Van Herpen et al. | 250/504 R |

FOREIGN PATENT DOCUMENTS

| | | |
|---|---|---|
| EP | 1 434 098 A2 | 6/2004 |
| EP | 1 491 963 A2 | 12/2004 |
| WO | WO 2004/012207 A2 | 2/2004 |

* cited by examiner

*Primary Examiner*—Nikita Wells
*Assistant Examiner*—Johnnie L Smith, II
(74) *Attorney, Agent, or Firm*—Pillsbury Winthrop Shaw Pittman LLP

(57) ABSTRACT

A radiation system for providing a projection beam of radiation in a lithographic apparatus is disclosed. The radiation system includes an EUV source for providing EUV radiation, and a contamination barrier that includes a plurality of foil plates for trapping contaminant material coming from the EUV source. The foil plates are arranged in an optically closed arrangement so that at least one of the foil plates reflects EUV radiation passing the contamination barrier at least one time.

27 Claims, 9 Drawing Sheets

RADIATION SYSTEM AND LITHOGRAPHIC APPARATUS

FIELD

The present invention relates to a radiation system and lithographic apparatus that includes the radiation system. Specifically, the invention relates to a radiation system for providing a projection beam of radiation that includes an EUV source for providing EUV radiation, and a contamination barrier that includes a plurality of foil plates for trapping contaminant material coming from the radiation source.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction), while synchronously scanning the substrate parallel or anti-parallel to this direction. It is also possible to transfer the pattern from the patterning device to the substrate by imprinting the pattern onto the substrate.

In addition to EUV radiation, radiation sources used in EUV lithography generate contaminant material that may be harmful for the optics and the working environment in which the lithographic process is carried out. Such is especially the case for EUV sources operating via a laser induced plasma. Hence, in EUV lithography, a desire exists to limit the contamination of the optical system that is arranged to condition the beams of radiation coming from an EUV source. To this end, it is known to use a so-called foil trap, for instance, as disclosed in EP1491963. A foil trap uses a high number of closely packed foils aligned generally parallel to the direction of the light generated by the EUV source. Contaminant debris, such as micro-particles, nano-particles and ions can be trapped in walls provided by foil plates. Thus, the foil trap functions as a contamination barrier trapping contaminant material from the source. Generally, these foil traps are designed to have a sufficiently large dimension to trap virtually any contaminant particle traveling through the trap. Indeed, a large fraction of debris is captured since the velocity directions are mostly non parallel to the foil plates so that impact of the contaminant material follows eventually. Also, smaller particles are traveling in typical random diffusion like paths, where eventually most of the particles are trapped. However, a small fraction travels in a direction and at a velocity such that it is able to travel through the foil trap, and thus able to cause undesired contamination of the optics.

SUMMARY

It is desirable to further limit the possibility of contaminant material to pass the contamination barrier and cause undesired contamination of the lithographic system. It is further desirable to provide a radiation system that is optimally free of contamination while keeping an optimized radiation yield.

In an embodiment of the present invention, a radiation source for providing a projection beam of radiation in a lithographic apparatus is provided. The radiation system includes an EUV source for providing EUV radiation, and a contamination barrier that includes a plurality of foil plates for trapping contaminant material coming from the EUV source. The foil plates are arranged in an optically closed arrangement so that at least one of the foil plates reflects EUV radiation passing the contamination barrier at least one time.

By the closed arrangement, fast debris traveling in straight lines can be trapped by the foil trap. Radiation is permitted to pass the contamination barrier via reflection of the foils. It is noted that WO 2004/012207 discloses a lobster eye like X-ray optical element for focusing an X-ray source into a parallel beam. To this end, substantially parallel plated optics are disclosed which collimate the beam through reflection. Although the publication suggests that this arrangement has some debris-mitigating effect, it does not provide a contamination barrier since it does not provide a foil trap configuration of closely packed plates. In addition, the configuration is not optically closed.

In an embodiment, a lithographic apparatus is provided. The apparatus includes a radiation system that includes an EUV source for providing EUV radiation, and a contamination barrier that includes a plurality of foil plates for trapping contaminant material coming from the EUV source. The apparatus also includes a patterning device for patterning the radiation, and a projection system for projecting the patterned radiation onto a substrate. The foil plates are arranged in an optically closed arrangement so that at least one of the foil plates reflects EUV radiation passing the contamination barrier at least one time.

In an embodiment, a method of operating an EUV contamination barrier that includes a plurality of closely packed foil plates in an EUV radiation system is provided. The method includes heating the barrier so as to liquefy the faces of the foil plates.

In an embodiment, a contamination barrier that includes a plurality of closely packed foil plates for trapping contaminant material coming from an EUV radiation source is provided. The foil plates are arranged in an optically closed arrangement so that EUV radiation passing the contamination barrier is reflected at least one time via at least one of the foil plates.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
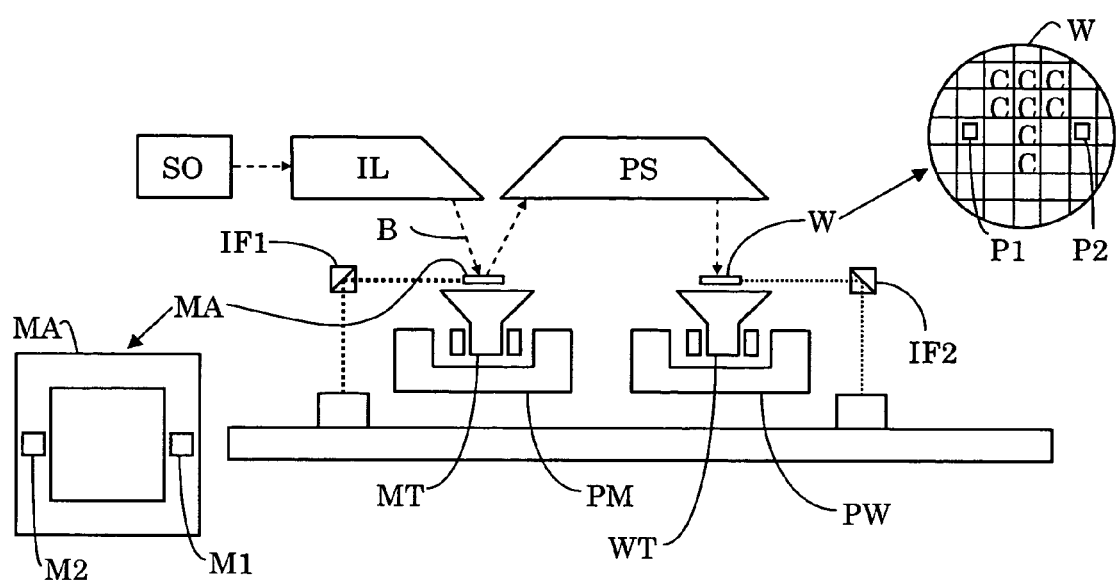
FIG. 1 depicts a lithographic apparatus according to an embodiment of the invention.

FIG. 1 schematically depicts a lithographic apparatus according to an embodiment of the invention. The apparatus includes: an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by the patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as, for example, whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so-called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well-known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate, for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type in which at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well-known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system including, for example, suitable directing mirrors and/or a beam expander. In other cases, the source may be an integral part of the lithographic apparatus, for example, when the source is a mercury lamp. The source SO and the illuminator IL, together with the beam delivery system, if required, may be referred to as a radiation system.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus may be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
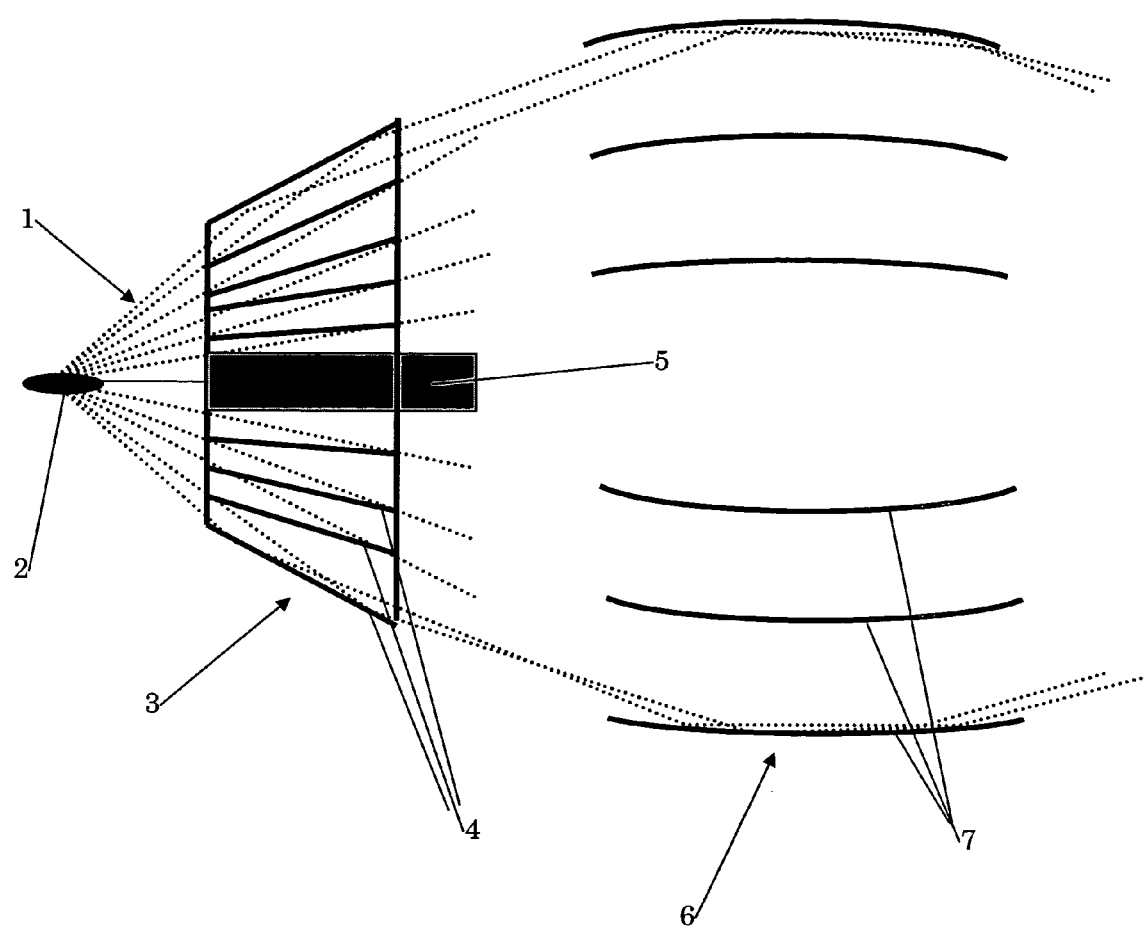
FIG. 2 depicts an embodiment of the invention.

FIG. 2 shows a basic configuration for a radiation system according to the invention. In the Figure, the dashed lines represent EUV radiation 1 coming from an EUV source 2, typically a laser induced plasma source such as a Tin source or Xe source, which are known per se. A foil trap 3 functions as a contamination barrier for trapping contaminant material coming from the radiation source 2. To this end, the foil trap 3 is provided with a plurality of closely packed foil plates 4, typically arranged at a distance of 0.3–5 mm (normally about 2 mm), whereas the foil plates 4 have a length dimension in substantially radial direction from the source 2 of typically a few cm. Preferred embodiments have lengths ranging from 1.5–5 cm. Along a central axis, the source 2 is shielded by a heat shield 5.

The foils 4 according to an embodiment of the invention are positioned in an optically closed arrangement so that they block the path of the light and the debris particles. The walls of the foils 4 are provided with an optically reflective layer, so that the radiation is reflected so that the debris particles are blocked. In a preferred embodiment, the foil plates 4 are stacked, such as depicted in FIG. 2 in a cone configuration. To this end, the foil plates 4 are shaped in a truncated cone and stacked into each other via distancing ribs (not depicted) to maintain a predetermined orientation towards each other. The cone-shape embodiment is dimensionally stable because it has great intrinsic stiffness. Other embodiments, however, are also contemplated, such as parallel plated generally flat platelets or a typical lobster eye configuration in which closely packed plates that are oriented in stacks substantially radial relative to the source 2 in an optically closed configuration. For ease of construction, within a stack, the foil plates may be oriented generally parallel. A stack is then a packet of typically 2–5 foils. In addition, the foil trap 3 may be designed to have shell formed curved surfaces or can use a configuration which is known as a "stretched fingers type" configuration.

As is schematically indicated in FIG. 2, in downstream direction of the radiation, relative to the source 2, a collector element 6 is present and has a converging power for collecting and converging the EUV radiation from the EUV source 2 to further EUV optics. Such a collector element 6 is typically cylinder symmetric along a central axial direction and includes concentrically curved shell formed reflective surfaces 7 that are stacked at a distance ranging substantially between 1 and 7 cm.

Figure 3:
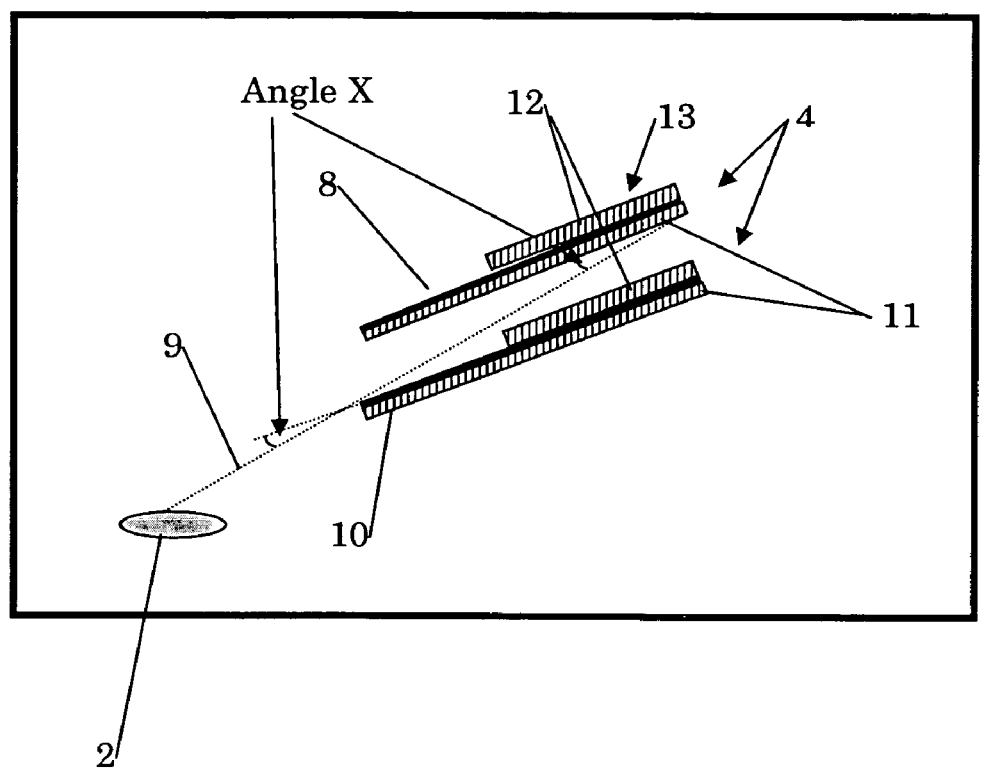
FIG. 3 depicts a detail view of a foil plate design for the embodiment of FIG. 2.

FIG. 3 schematically illustrates a design strategy for designing the foil trap 3 illustrated in FIG. 2. To this end, a first foil 8 of a certain length is placed at an angle X relative to a beam path 9 of an outer reflecting ray of a beam originating from the source 2. Typically, such an angle X may be about 0.5–10°. The back side of the next foil 10 is placed on the beam path 9 of the outer ray. The front part of this next foil 10 will start here. The length of this next foil is determined by the distance of the foils and the angle X. The positioning of the foils can be done such that every ray of light has the same range of angles of incidence on the foil. This is possible, because the foils have a certain thickness (~0.1 mm), thereby giving enough flexibility for the angle of the foils. For the angle X of the foil plates 4, it is considered that only a fraction of the beam rays that is incident at an angle smaller than the grazing angle, which is typically 0.5–10° for EUV-reflective materials 11 will be reflected (see also FIG. 7).

When the foil trap 3 is operated at a temperature above the melting point of such materials, in particular, for Tin, above a temperature of about 230° C. (the melting point of Tin is 231,9° C.), such operation results in smooth surfaces of tin fluid and significantly increases the reflectivity for EUV light at the shells. In addition, incoming debris is absorbed in the liquefied surface, under the influence of cohesion forces and gravity force will rearrange into a substantially flat surface. This effect can be characterized as "self healing" of the mirror surface. The foil trap 3 may be arranged to heat up, in operation, due to the inherent energy absorption of the plasma source. In addition, as is shown in FIG. 3, additional heating elements 12 may be provided in or on the foil plates 4, in particular, on the "shadow" side 13 of the foil plates 4 which are designed to receive no exiting radiation. Such heating elements may be thermoabsorbing coating or active elements, such as electrical heating circuits etc.

Figure 4:
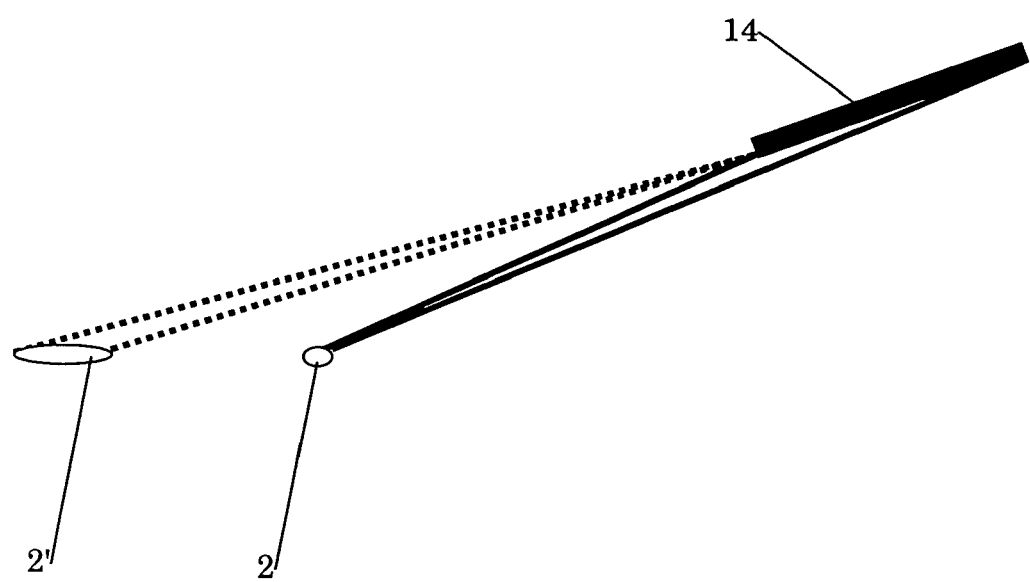
FIG. 4 depicts a virtual image of the source.
Figure 5:
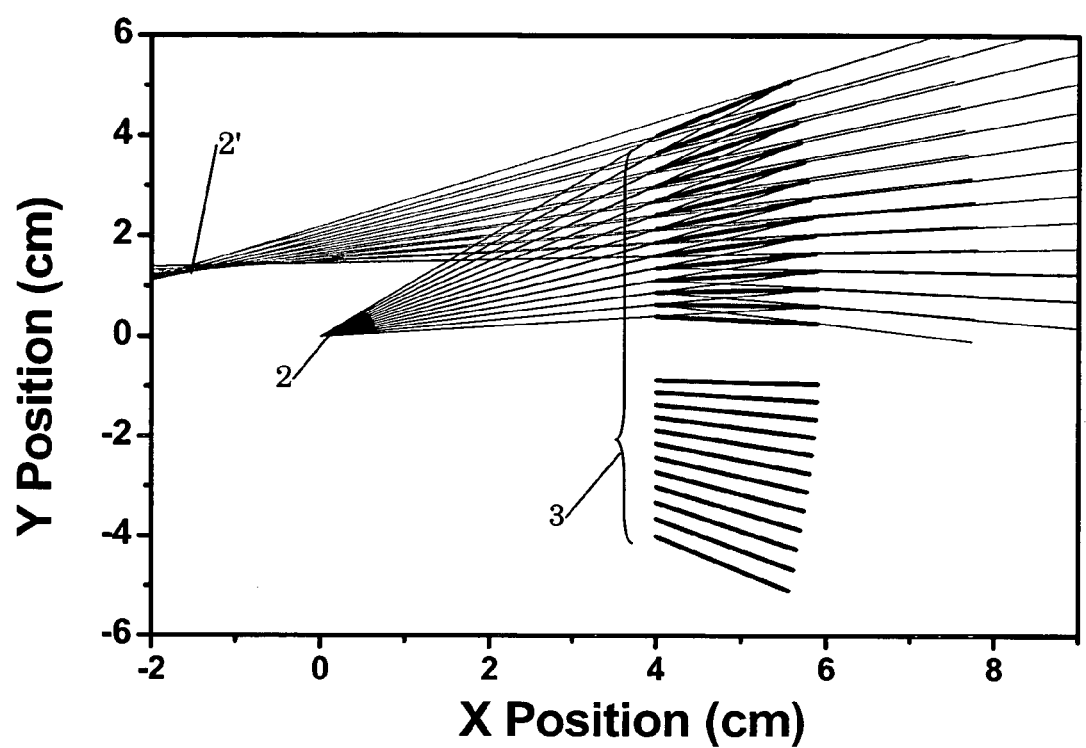
FIG. 5 further depicts schematic imaging characteristics of the embodiment of FIG. 2.

FIG. 4 and FIG. 5 illustrate an effect that is inherent in the weakly convergent orientation of cone shaped planar oriented shells used in the embodiment of FIG. 2. This effect is indicated as "virtual stretching" or "virtual enlargement" of the source 2. Also, in addition to stretching, when the EUV light is reflecting on the foil 14, shown in FIG. 4, the virtual position of the source 2 shifts to a location 2' slightly further away (typically this shift is between 0 and 1 cm). This is not a problem for collecting the EUV radiation with the collector 6, because the position of the collector 6 may be adjusted to compensate for this. Due to different angles of reflections from the front- and backside of the foil 14, stretching of the source occurs. The effect of this is that the virtual source will look larger than the real source. If the virtual source becomes too large, this may become a problem, because the collector 6 may not be able to effectively collect all power from the virtual source. The 'real' source for the EUV radiation is called the pinch, and has typical dimensions of 0.3×1 mm. The virtual pinch is preferably kept within a 2×2 mm area or within a 8 mm³ volume or, more specifically, within a 1.3×1.6 mm cylinder for a Tin source aligned with the central axis of the foil trap.

In addition, the EUV transmittance of the reflective foil trap depends on a variety of factors:

1. EUV blocked by the front sides of the foils, depending on the thickness of the platelets.
2. EUV lost due to the reflection on the foils, depending on the angle of incidence.
3. EUV lost, because the virtual pinch size is bigger than the maximum allowed pinch size
4. Some extra EUV may be collected, because of the weakly converging power of the arrangement so that a larger spatial angle of radiation may be transferred to the EUV collector.

Table 1 lists some of these values, as was calculated with ray-tracing, using a foil length of 1.9 cm and a foil thickness of 0.1 mm. The chance of a reflected light beam to hit an adjacent foil is hereby taken into account. Because the foil trap is designed in such a way that a reflected beam should not hit an adjacent foil, the effect is not present for a point source. However, due to the finite size of the pinch, there is some EUV loss due to this effect, especially for small reflection angles. In addition, Table 2 shows a transmittance for a reflective Tin foil trap with a foil length of 3.8 cm using a Tin source, and Table 3 shows a transmittance for a reflective foil trap with a foil length of 3.8 cm using diamond (Tin source).

TABLE 1

Transmittance for reflective tin foil trap with a foil length of 1.9 cm (Tin source).

| Average angle (degrees) | Virtual pinch shift | Amount within maximum virtual pinch size | Blocked due to thickness of the foils | EUV reflectivity | Extra collected EUV due to converging | Total transmittance |
|---|---|---|---|---|---|---|
| 0.42 (max 0.5) | −0.26 cm | 69.5% | 57.4% (142 foils) | 97.2% | 104.0% | 40.3% |
| 0.86 (max 1) | −0.38 cm | 75.2% | 73.0% (90 foils) | 94.3% | 110.6% | 57.3% |
| 1.71 (max 2) | −0.69 cm | 72.7% | 84.1% (53 foils) | 89.0% | 124.4% | 67.7% |
| 2.57 (max 3) | −1.08 cm | 68.6% | 88.6% (38 foils) | 83.9% | 140.4% | 71.6% |

TABLE 2

Transmittance for reflective tin foil trap with a foil length of 3.8 cm (Tin source).

| Average angle (degrees) | Virtual pinch shift | Within maximum virtual pinch size | Blocked due to thickness | EUV reflectivity | Heat-shield + Extra collected EUV | Total transmittance |
|---|---|---|---|---|---|---|
| 0.78 (max 1) | −0.37 cm | 83.7% | 85.6% (65 foils) | 94.8% | 108.4% | 73.6% |
| 1.55 (max 2) | −0.69 cm | 78.3% | 88.9% (37 foils) | 90.0% | 121.4% | 76.1% |
| 2.32 (max 3) | −1.02 cm | 69.6% | 92.2% (26 foils) | 85.4% | 135.9% | 74.5% |

TABLE 3

Transmittance for reflective foil trap with a foil length of 3.8 cm, using diamond (Tin source).

| Average angle (degrees) | Virtual pinch shift | Amount within maximum virtual pinch size | Blocked due to thickness of the foils | EUV reflectivity | Extra collected EUV due to converging | Total transmittance |
| --- | --- | --- | --- | --- | --- | --- |
| 0.76 (max 1) | −0.38 cm | 83.7% | 85.6% (65 foils) | 98.5% | 108.4% | 76.5% |
| 1.55 (max 2) | −0.70 cm | 78.3% | 88.9% (37 foils) | 97.2% | 121.4% | 82.1% |

In use, the invention relies on the reflective properties of the foil plates 4 for the radiated EUV-rays. Thus, a number of ions that are stopped may cause damage to the foils. Therefore the foils preferably are damage-resistant, or arranged so that they can be repaired or dispensed during operation. The invention preferably uses Tin as a reflective material for a Tin source, since it allows absorption of the contaminants as discussed with reference to FIG. 3. More generally, foils having material properties matching the contaminant materials may be used to absorb these materials.

Also, a standard type of foil may be used, such as a Molybdenum foil. The surface roughness typically is in the order of a few nm, more specifically, 5–50 nm.

Figure 6:
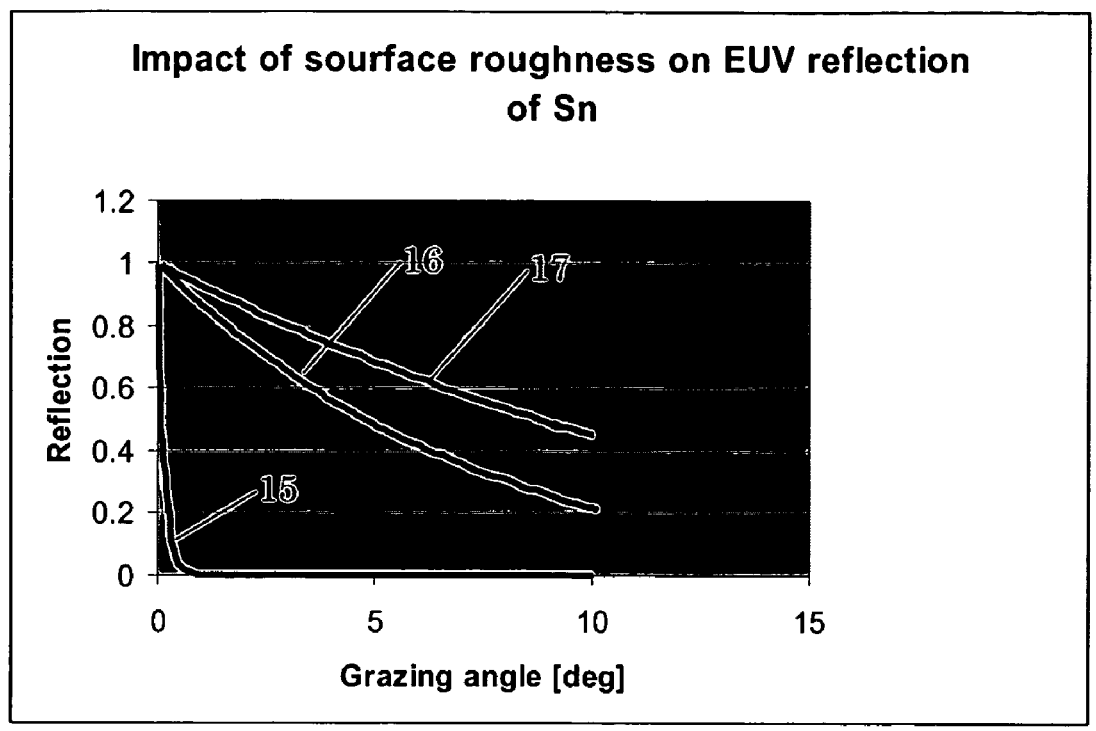
FIG. 6 depicts the effect of surface roughness on the reflectivity of the foil trap.
Figure 7:
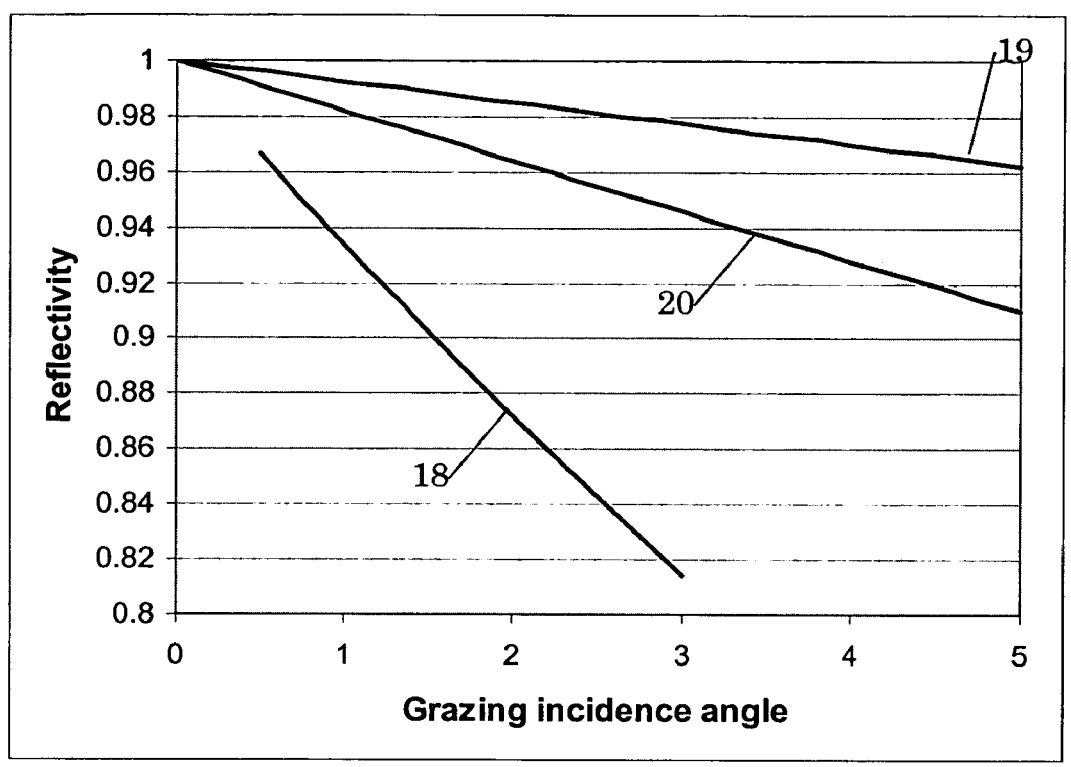
FIG. 7 depicts the reflective properties for different materials used.

FIG. 6 and FIG. 7 provide reflection characteristics for typical materials that may be used for foil plates.

In particular, FIG. 6 illustrates a reflectivity in relation to a typical surface roughness a Tin layer. It can be shown that for higher surface roughness (50 nm, lowest line 15) the reflectivity rapidly decreases for larger angles of incidence. For smaller roughness (10 nm, middle line 16, resp. 5 nm upper line 17), the reflectivity is much higher. For a grazing angle of about 5°, about 50% is reflected, whereas for grazing angles smaller than 1°, a reflectivity of more than 80% is obtained.

In addition, FIG. 7 shows the reflective properties for a variety of materials, in particular: Tin (reference 18), Molybdenum (reference 19) and Diamond (reference 20). Although Mo has better reflective properties, in practice Tin layered foils are beneficial because of an increased service life time and lower surface roughness (because the melted tin will form a smooth surface with very low roughness). Indeed, as previously described, a Tin layered wall may be used virtually unhindered by impacting Tin debris. Another type of foil plate is the use of diamond as a surface material, which has good reflective properties and is highly damage resistant.

Figure 8:
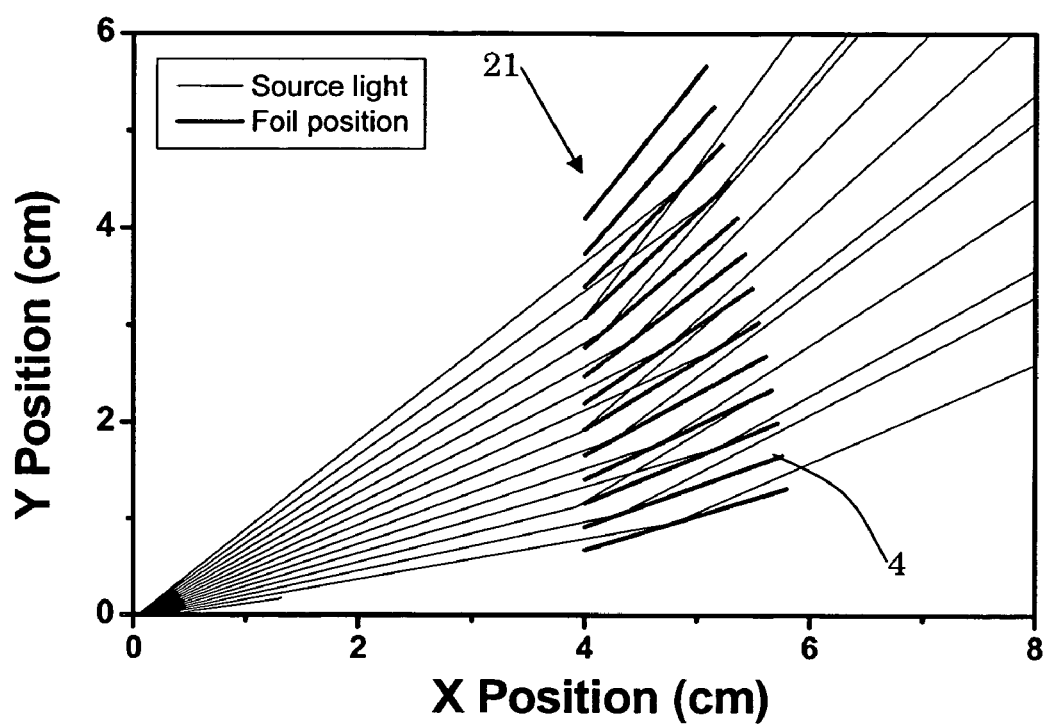
FIG. 8 depicts an embodiment of the invention.

FIG. 8 shows an alternative configuration for the inventive foil trap 21 that includes reflecting foil plates 4. In this embodiment, a weakly diverging configuration is displayed where, as in the embodiment of FIG. 2, foil plates 4 are arranged in an optically closed arrangement so that EUV radiation passing the foil trap 21 is reflected via a foil plate 4. However, the foil plates 4 in FIG. 8 are oriented to diverge incoming EUV radiation. This has as an effect that the virtual pinch as discussed with reference to FIG. 4 is stretched much less than in the embodiment of FIG. 2. Due to the more compact nature of the virtual pinch, the collector 6 is, in principle, able to collect more light and provide a better beam profile, provided the divergence is within limits so that the diverging beam actually enters the collector. Further, preferably, the foil plates 4 are dimensioned so that the majority of EUV beams only pass after a single reflection. Further, preferably, the "shadow" side of the foil plates, which is, the side opposite a reflecting surface, is arranged to stop accidental incoming rays so as to optimize a preferred direction of EUV radiation in the collector. As in FIG. 2, such a collector is typically located downstream of the foil trap 21 and not illustrated here.

In addition to the reduced virtual stretching effect, also, the position of the virtual source is shifted somewhat in the direction of the foil trap 21. This has as an effect that the collector can be placed a small distance further downstream the EUV beam, in typical distances varying from 0.2–2.5 cm. Such displacement of the collector can be beneficial for yielding extra mitigation length. For example, the 1.9 cm long foil trap with 3 degrees reflection has a virtual pinch at 0.84 cm. This means that the foil trap effectively only uses 1.06 cm of mitigation length, instead of 1.9 cm. In the embodiment discussed with reference to FIG. 2, this effect is opposite (for example, a 1.9 cm/3 degrees foil trap will uses 0.7 cm extra mitigation length).

Table 4 and Table 5 show the collection efficiency and transmittance of this foil trap, calculated using 2-dimensional ray-tracing.

TABLE 4

Transmittance for inverted reflective foil trap (foil length 1.9 cm) (Tin).

| Average angle (degrees) | Virtual pinch shift | Within maximum virtual pinch size | Blocked due to thickness | Sn EUV reflectivity | Heat-shield + lost due to angle | Total transmittance |
| --- | --- | --- | --- | --- | --- | --- |
| 0.82 (max 1) | 0.34 cm | 96.5% | 70.6% (98 foils) | 94.6% | 91.7% | 59% |
| 1.72 (max 2) | 0.60 cm | 91.1% | 83.5% (55 foils) | 88.8% | 84.1% | 55% |
| 2.58 (max 3) | 0.84 cm | 84.6% | 88.3% (39 foils) | 84.0% | 72.4% | 45% |
| 4.27 (max 5) | 1.30 cm | 70.1% | 92.8% (24 foils) | 74.5% | 61.7% | 30% |

TABLE 4-continued

Transmittance for inverted reflective foil trap (foil length 1.9 cm) (Tin).

| Average angle (degrees) | Virtual pinch shift | Within maximum virtual pinch size | Blocked due to thickness | Sn EUV reflectivity | Heat-shield + lost due to angle | Total transmittance |
|---|---|---|---|---|---|---|
| 8.56 (max 10) | 2.29 cm | 59.3% | 96.1% (13 foils) | 54.4% | 32.1% | 10% |

TABLE 5

Transmittance for inverted reflective foil trap (foil length 3.8 cm) (Tin).

| Average angle (degrees) | Virtual pinch shift | Within maximum virtual pinch size | Blocked due to thickness | Sn EUV reflectivity | Heat-shield + lost due to angle | Total transmittance |
|---|---|---|---|---|---|---|
| 0.80 (max 1) | 0.34 cm | 97.8% | 78.7% (71 foils) | 94.7% | 90.3% | 66% |
| 1.60 (max 2) | 0.59 cm | 91.4% | 88.6% (38 foils) | 89.7% | 81.8% | 59% |
| 2.35 (max 3) | 0.84 cm | 84.0% | 92.2% (26 foils) | 85.3% | 74.2% | 49% |
| 3.9 (max 5) | 1.28 cm | 73.8% | 94.9% (17 foils) | 76.5% | 59.8% | 32% |
| 7.78 (max 10) | 2.21 cm | 55.0% | 97.3% (9 foils) | 57.7% | 30.0% | 9% |

For comparison, the reflective foil trap described in FIG. 2 has a maximum transmittance of ~75% for a foil length of 3.8 cm. Since in the embodiment of FIG. 2 extra EUV radiation can be collected due to the larger collection angle, this embodiment has a somewhat lower total EUV transmittance.

Figure 9:
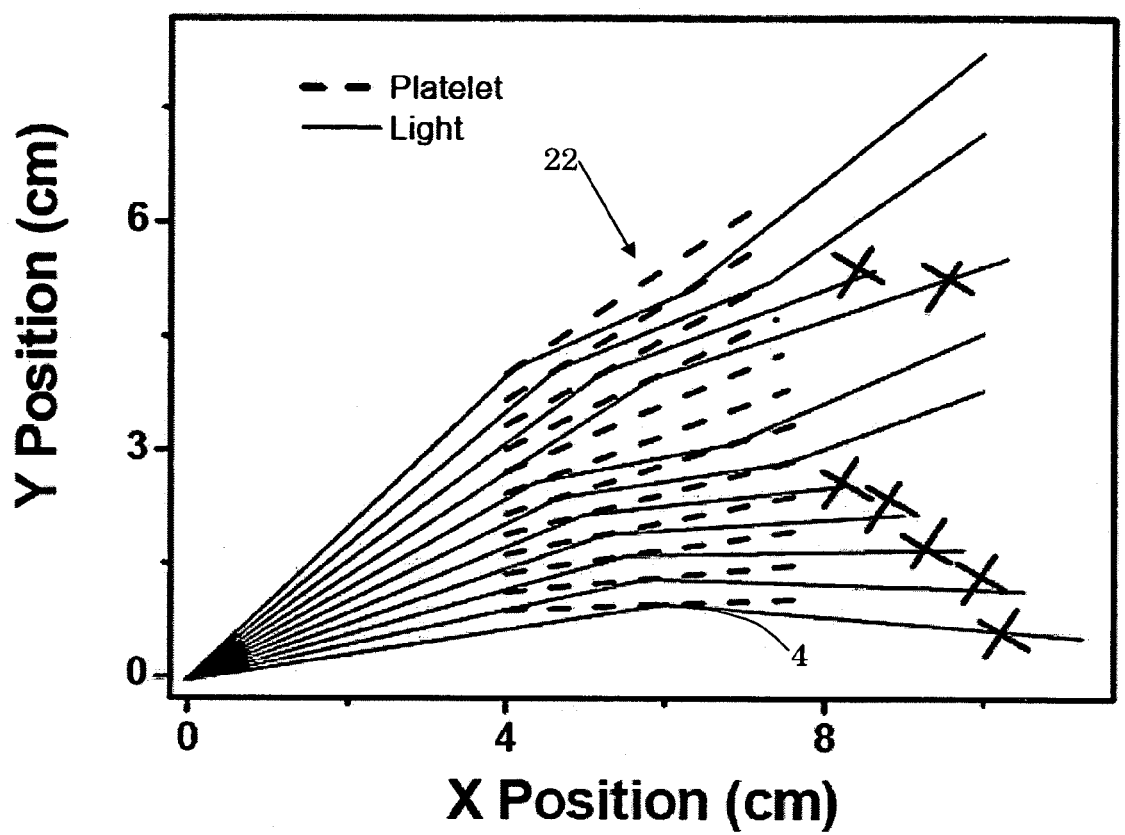
FIG. 9 depicts an embodiment of the invention.

FIG. 9 shows another embodiment of the invention. In this embodiment, a foil trap 22 is proposed which is dimensioned to provide a double reflection for passing EUV radiation. This embodiment has as a benefit that, in contrast to the embodiments discussed with reference to FIG. 2 and FIG. 8, the EUV source is imaged virtually without stretching and without a shift along the optical axis. Due to a possible non-parallel nature of adjacent foil plates (see FIG. 4), a small shift may be possible. Such a shift is compared to the single reflection embodiments, however, far smaller, e.g., in the order of at most 2 mm.

Fast debris which may be able to escape through elastic scattering in a single reflection (generally following the beam path of EUV radiation) may be stopped in a second reflection when the EUV beam reflects for the second time at a foil plate opposite the first reflection spot 23. To provide a double reflection, generally, the foil plates 4 are longer than the single-reflective embodiments, typically about twice as long. Also, both opposite walls of the foil plates 4 are of a reflective nature, for example, both sides may be layered with a Tin layer. Due to the limited length of the foil trap, not all light is able to receive a second reflection. This light cannot be collected by the collector and, therefore, the maximum amount of collected radiation may be limited, which is indicated schematically by the X-s in the ray paths having a lower angle of emission. Hence, for lower emission angles, the collection efficiency is lower than for higher angles. This effect can be used to improve the efficiency of the foil trap, by adjusting the reflection angle or varying the length of the foil plates for the lower emission angles.

Otherwise, fewer foils may be needed, since only an exit path may be provided for rays having a large emission angle (relative to the optical axis). For such an annular shaped beam profile, a virtual pinch can be rendered that is substantially unshifted relative to the real pinch.

Using 2-dimensional ray-tracing calculations, the expected transmittance of the double-reflective foil trap for EUV radiation was determined as a function of different angles of incidence for the first foil. From the results shown in Table 6, it can be seen that the angle of incidence does not greatly affect the amount of collected EUV radiation. This is expected, because the pinch image is not deformed a lot by this type of foil trap. However, the maximum collected EUV radiation appears to be limited to about 50% due to light that is unable to receive a second reflection.

TABLE 6

Transmittance for double reflective foil trap with a foil length of 3.8 cm positioned 4 cm from the pinch

| Angle (deg) | Number of foils | Virtual Position | x Amount collected | Blocked due to thickness | Sn EUV reflectivity | Total collected |
|---|---|---|---|---|---|---|
| 0.7 (max 1) | 90 | 0.05 cm | 38% | 73.0% | 0.95 | 26% |
| 2.0 (max 3) | 38 | 0.1 cm | 52% | 88.6% | 0.87 | 40% |
| 3.1 (max 5) | 24 | 0.12 cm | 54% | 92.8% | 0.81 | 41% |
| 4.6 (max 10) | 13 | 0.2 cm | 53% | 97.0% | 0.73 | 38% |

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example, imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" as used herein encompass all types of electromagnetic radiation, including ultra-violet (UV) radiation (e.g. having a wavelength of or about 365, 355, 248, 193, 157 or 126 nm) and extreme ultra-violet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A radiation system for providing a projection beam of radiation in a lithographic apparatus, the radiation system comprising:
    an EUV source for providing EUV radiation; and
    a contamination barrier comprising a plurality of foil plates for trapping contaminant material coming from said EUV source,
    wherein said foil plates are arranged in an optically closed arrangement so that at least one of said foil plates reflects EUV radiation passing said contamination barrier at least one time.

2. A radiation system according to claim 1, wherein said contamination barrier is dimensioned to provide a single reflection for passing the EUV radiation.

3. A radiation system according to claim 1, wherein said contamination barrier is arranged to provide a converging power.

4. A radiation system according to claim 3, wherein said converging power is chosen to provide a virtually enlarged radiation source that is limited to a volume of 8 mm$^3$.

5. A radiation system according to claim 1, wherein said contamination barrier is arranged to provide a diverging power.

6. A radiation system according to claim 1, wherein said contamination barrier is dimensioned to provide a double reflection for passing EUV radiation.

7. A radiation system according to claim 1, wherein said EUV source is a laser induced plasma source.

8. A radiation system according to claim 7, wherein said plasma source comprises Sn or Xe.

9. A radiation system according to claim 1, wherein said foil plates are layered with a material that is substantially identical to the contaminant material.

10. A radiation system according to claim 9, wherein said material comprises Sn.

11. A radiation system according to claim 1, wherein said foil plates comprise a reflective face that is arranged to liquefy in use for absorbing contaminant material and/or for reducing surface roughness of said foil plates.

12. A radiation system according to claim 11, wherein said foil plates comprise a first reflective layer designed to provide reflection for the EUV radiation and a second absorbing layer designed to absorb thermal energy.

13. A radiation system according to claim 12, wherein said first and second layers are arranged at opposite faces of the foil plates.

14. A radiation system according to claim 11, wherein a heating element is provided to liquefy said reflective face.

15. A radiation system according to claim 14, wherein said heating element is provided on a shadow side of the reflective face.

16. A radiation system according to claim 1, wherein said foil plates are layered with a material selected from the group consisting of Sn, Mo, and diamond.

17. A radiation system according to claim 1, wherein said foil plates are oriented in a stacked cone configuration.

18. A radiation system according to claim 1, wherein said foil plates are oriented in a lobster eye configuration comprising non parallel stacks oriented substantially radial relative to the source in an optically closed configuration, wherein the stacks are provided with closely packed parallel oriented plates.

19. A radiation system according to claim 1, wherein said foil plates are closely packed.

20. A radiation system according to claim 19, wherein said foil plates are stacked at a distance ranging substantially between 0.3 and 5 mm.

21. A radiation system according to claim 1, further comprising a collector element.

22. A radiation system according to claim 21, wherein said collector element is cylinder symmetric and comprises concentrically curved reflective surfaces.

23. A radiation system according to claim 22, wherein said reflective surfaces are stacked at a distance ranging substantially between 1 and 7 cm.

24. A lithographic apparatus comprising:
    a radiation system comprising
        an EUV source for providing EUV radiation; and
        a contamination barrier comprising a plurality of foil plates for trapping contaminant material coming from said EUV source;
    a patterning device for patterning the radiation; and
    a projection system for projecting the patterned radiation onto a substrate, wherein said foil plates are arranged in an optically closed arrangement so that at least one of said foil plates reflects EUV radiation passing said contamination barrier at least one time.

25. A lithographic apparatus according to claim 23, further comprising a collector element having a converging power for converging said EUV radiation from said EUV source.

26. A method of operating an EUV contamination barrier comprising a plurality of closely packed foil plates in an EUV radiation system, the method comprising heating said barrier so as to liquefy the faces of said foil plates.

27. A contamination barrier comprising a plurality of closely packed foil plates for trapping contaminant material coming from an EUV radiation source, wherein said foil plates are arranged in an optically closed arrangement so that EUV radiation passing said contamination barrier is reflected at least one time via at least one of said foil plates.

* * * * *